(12) United States Patent
Osuga et al.

(10) Patent No.: US 10,276,672 B2
(45) Date of Patent: Apr. 30, 2019

(54) VERTICAL SEMICONDUCTOR DEVICE HAVING A TRENCH GATE A BASE CONTACT REGION

(71) Applicant: SII Semiconductor Corporation, Chiba-shi, Chiba (JP)

(72) Inventors: Yuki Osuga, Chiba (JP); Hirofumi Harada, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/825,896

(22) Filed: Nov. 29, 2017

(65) Prior Publication Data
US 2018/0204918 A1 Jul. 19, 2018

(30) Foreign Application Priority Data

Jan. 19, 2017 (JP) .................. 2017-007552

(51) Int. Cl.
| | |
|---|---|
| *H01L 29/06* | (2006.01) |
| *H01L 29/08* | (2006.01) |
| *H01L 29/10* | (2006.01) |
| *H01L 29/66* | (2006.01) |
| *H01L 29/78* | (2006.01) |
| *H01L 21/265* | (2006.01) |
| *H01L 29/417* | (2006.01) |

(52) U.S. Cl.
CPC .... *H01L 29/41741* (2013.01); *H01L 29/1095* (2013.01); *H01L 29/41766* (2013.01); *H01L 29/66727* (2013.01); *H01L 29/66734* (2013.01); *H01L 29/7813* (2013.01); *H01L 21/26586* (2013.01); *H01L 29/0696* (2013.01); *H01L 29/0865* (2013.01)

(58) Field of Classification Search
CPC ......... H01L 29/41741; H01L 29/66727; H01L 29/66734; H01L 29/1095; H01L 29/7813; H01L 29/0696; H01L 29/7827; H01L 29/41766
See application file for complete search history.

(56) References Cited

U.S. PATENT DOCUMENTS

| | | | |
|---|---|---|---|
| 6,351,009 B1 | 2/2002 | Kocon et al. | |
| 7,064,373 B2 * | 6/2006 | Goebel | ............. H01L 27/10841 257/301 |

(Continued)

FOREIGN PATENT DOCUMENTS

| | | |
|---|---|---|
| JP | 2005-116649 A | 4/2005 |
| JP | 5118270 B2 | 1/2013 |

*Primary Examiner* — Ngan V Ngo
(74) *Attorney, Agent, or Firm* — Brinks Gilson & Lione (57) ABSTRACT

A semiconductor device includes: a drain region formed on a rear surface side of a substrate; a base layer formed between the drain region and a front surface of the substrate; a trench formed in the substrate; a gate insulating film covering an inner surface of the trench from a bottom of the trench to a first height; a gate electrode filling the trench to the first height; an insulating film filling the trench to a second height higher than the first height; a source electrode filling a remaining part of the trench; a base contact region formed in a surface of the substrate and has one side contacting the source electrode; and a source region having an upper surface contacting a part of a bottom surface of the base contact region, one side contacting a side of the trench and is partially contacting the source electrode.

4 Claims, 11 Drawing Sheets

(56) References Cited

U.S. PATENT DOCUMENTS

| | | | |
|---|---|---|---|
| 2003/0222304 A1* | 12/2003 | Ohtani | H01L 29/7813 |
| | | | 257/330 |
| 2011/0136310 A1* | 6/2011 | Grivna | H01L 29/407 |
| | | | 438/270 |
| 2012/0061722 A1* | 3/2012 | Hashimoto | H01L 23/4824 |
| | | | 257/133 |
| 2012/0276726 A1* | 11/2012 | Lin | H01L 21/2257 |
| | | | 438/561 |
| 2014/0103364 A1* | 4/2014 | Nakano | H01L 29/435 |
| | | | 257/77 |
| 2015/0372090 A1* | 12/2015 | Oosawa | H01L 29/78 |
| | | | 257/331 |
| 2016/0020315 A1* | 1/2016 | Hirler | H01L 29/0696 |
| | | | 257/330 |
| 2016/0293753 A1* | 10/2016 | Inoue | H01L 29/0623 |
| 2016/0300913 A1* | 10/2016 | Siemieniec | H01L 29/407 |
| 2017/0200799 A1* | 7/2017 | Amali | H01L 21/0273 |
| 2017/0207330 A1* | 7/2017 | Enomoto | H01L 21/2636 |
| 2018/0226481 A1* | 8/2018 | Wutte | H01L 29/4236 |

\* cited by examiner

VERTICAL SEMICONDUCTOR DEVICE HAVING A TRENCH GATE A BASE CONTACT REGION

RELATED APPLICATIONS

This application claims priority under 35 U.S.C. § 119 to Japanese Patent Application No. 2017-007552 filed on Jan. 19, 2017, the entire content of which is hereby incorporated by reference.

BACKGROUND OF THE INVENTION

1. Field of the Invention

The present invention relates to a semiconductor device and a method of manufacturing the semiconductor device, and more particularly, to a semiconductor device that includes a vertical MOSFET with a trench gate and a method of manufacturing the semiconductor device.

2. Description of the Related Art

As one of related-art vertical MOSFETs, the following vertical MOSFET is proposed, which is disclosed in, for example, Japanese Patent No. 5118270. Specifically, a gate electrode is formed only in the lower part of a trench formed in a substrate, and the upper part of the trench is filled with an interlayer insulating film for insulating a source electrode and the gate electrode from each other, so that the upper surface of the interlayer insulating film is substantially coplanar with the surface of the substrate. The source electrode is formed on the upper surface of the interlayer insulating film and the surface of the substrate. This configuration eliminates a contact opening for connecting a source electrode formed on an interlayer insulating film to a source region and a base contact region of the surface of a substrate, which is necessary in a case in which a gate electrode is filled up to the upper part of a trench, and an interlayer insulating film is formed on the surface of a substrate. As a result, the device can be downsized in its lateral direction.

In addition, in Japanese Patent No. 5118270 (see, in particular, FIG. 4A, FIG. 4B, and FIG. 5), there is a disclosure that the source regions and base contact regions are alternatively arranged in the surface of the substrate along the trenches disposed in a stripe pattern so that an interval between the adjacent trenches is reduced, with the result that the device can be further downsized.

However, in the related-art vertical MOSFET, which is proposed in, for example, Japanese Patent No. 5118270, in order to connect the source electrode to the source region and the base contact region, the source region and the base contact region are required to be arranged in the surface of the substrate in the lateral direction. The source region and the base contact region are accordingly required to be arranged with a certain margin in the lateral direction in consideration of the variation in manufacture. It is therefore difficult to still further downsize the device.

Further, in the structure in which the source regions and the base contact regions are alternatively arranged in the surface of the substrate along the trenches disposed in the stripe pattern, which is also disclosed in Japanese Patent No. 5118270, it is necessary to form the base contact regions in the surface of the substrate while reducing the area of the source regions necessary for channel formation. No channel is formed in the regions in which the base contact regions are formed, which results in a low channel density.

SUMMARY OF THE INVENTION

It is an object of the present invention to provide a semiconductor device having a vertical MOSFET which suppresses a decrease in channel density while reducing its size, and a manufacturing method thereof.

In one embodiment of the present invention, there is provided a semiconductor device including: a substrate; a drain region formed in the substrate and having a predetermined thickness from a rear surface of the substrate, the drain region being a first conductivity type; a trench reaching an upper surface of the drain region from a front surface of the substrate; a base layer formed on the drain region so as to be adjacent to the trench, the base layer being a second conductivity type; a gate insulating film covering an inner bottom surface and an inner side surface of the trench, the gate insulating film having an upper end portion which is located at a first height from the inner bottom surface of the trench; a gate electrode embedded in the trench to the first height via the gate insulating film; a first insulating film formed on the gate insulating film and the gate electrode in the trench to a second height which is higher than the first height; a source electrode formed on the first insulating film so as to fill a remaining part of the trench; a base contact region having a depth from the front surface of the substrate to a third height which is higher than the second height and lower than an opening end of the trench and having one side surface in contact with the source electrode, the base contact region being the second conductivity type and having a higher impurity concentration than the base layer; a source region having an upper surface in contact with a part of a bottom surface of the base contact region and one side surface that is in contact with an outer side surface of the trench and is at least partially in contact with the source electrode, the source region being the second conductivity type and being formed so that a region of the base layer that extends along the outer side surface of the trench from a bottom surface of the source region to the drain region serves as a channel region; and a drain electrode formed on the rear surface of the substrate so as to be in contact with the drain region.

In another embodiment of the present invention, there is provided a method of manufacturing a semiconductor device including: forming a base layer of a second conductivity type in an upper part of a substrate of a first conductivity type so that the base layer has a thickness smaller than a thickness of the substrate, while allowing a remaining region of the substrate to remain as a drain region of the first conductivity type; forming a trench which reaches the drain region from the front surface of the substrate; forming a gate insulating film on an inner bottom surface and an inner side surface of the trench; embedding a gate electrode into the trench via the gate insulating film; etching the gate electrode so that an upper surface of the ate electrode locates a first height from the bottom of the trench; forming a source region by implanting impurities from an inner side of the trench, the source region being in contact with a part of an outer side surface of the trench and at least having a depth from the front surface of the substrate to the first height; etching the gate insulating film so that an upper end portion of the gate insulating film locates the first height; forming a first insulating film on the gate insulating film and the gate electrode in the trench to a second height which is higher than the first height; forming a base contact region of the second conductivity type having a depth from the front surface of the substrate to a third height which is higher than the second height and lower than an opening end of the trench, the base contact region being in contact with another part of the outer side surface of the trench, an upper part of the base layer, and an upper part of the source region, and having a higher impurity concentration than the base layer;

and forming a source electrode on the first insulating film so that the source electrode is embedded in a remaining part of the trench (or a remaining part of the trench is filled with the source electrode), the source electrode being in contact with the source region and the base contact region.

The "base layer" and the "base contact region" in the above description may be referred to as, for example, "body region" and "body contact region", respectively, but "base layer" and "base contact region" are herein used.

According to the present invention, the source region and the base contact region are arranged in the vertical direction on the side surface of the trench so that the source electrode embedded the trench is in contact with the source region and the base contact region. This configuration eliminates the need in the related art to arrange the source region and the base contact region in the surface of the substrate in the lateral direction, and accordingly can downsize the device in the lateral direction (horizontal direction). Further, it is not necessary to reduce the area of the source regions necessary for channel formation in order to form the base contact regions, and effective channel regions are not reduced. A reduction in channel density can therefore be prevented.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will be now described herein with reference to illustrative embodiments.

Figure 1:
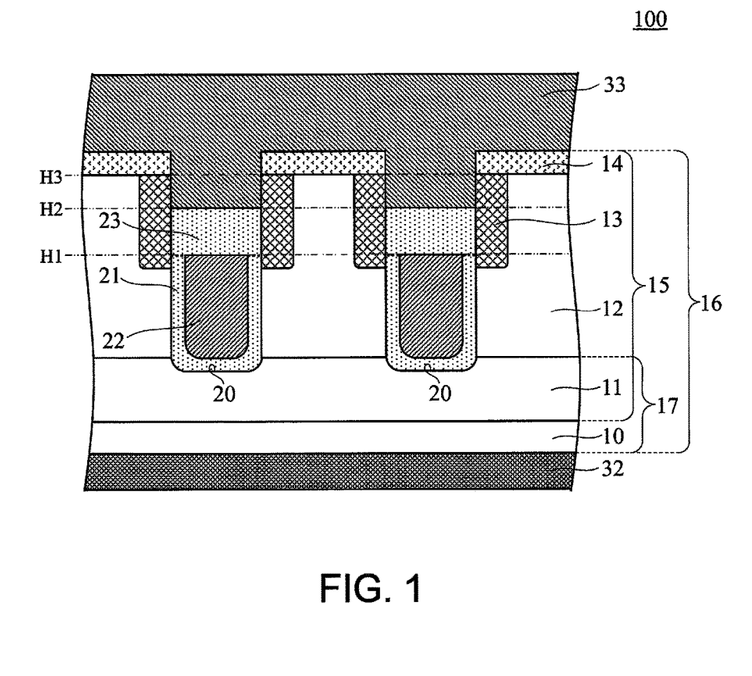
FIG. 1 is a sectional view for illustrating the structure of a semiconductor device according to a first embodiment of the present invention.

FIG. 1 is a sectional view for illustrating a semiconductor device 100 that includes a vertical MOSFET according to a first embodiment of the present invention.

The semiconductor device 100 of the first embodiment includes, as illustrated in FIG. 1, a heavily-doped semiconductor substrate 10 heavily doped with N-type impurities, and an epitaxial layer 15 formed on the heavily-doped semiconductor substrate 10. In the following description, the heavily-doped semiconductor substrate 10 and the epitaxial layer 15 are also collectively referred to as a substrate 16.

The substrate 16 includes a drain region 17 that includes the N-type heavily-doped semiconductor substrate 10 and an N-type semiconductor layer 11 formed on the heavily-doped semiconductor substrate 10, a P-type base layer 12 formed on the drain region 17, and trenches 20 extending from the front surface of the substrate 16 (epitaxial layer 15) to the upper surface of the drain region 17 through the base layer 12.

Inside the trench 20, a gate insulating film 21, a gate electrode 22, an interlayer insulating film 23, and a source electrode 33 are formed. The gate insulating film 21 covers the bottom surface of the trench 20 and the side surfaces of the trench 20 from the bottom surface to a first height H1. The gate electrode 22 is embedded in the trench 20 to the first height H1 via the gate insulating film 21. The interlayer insulating film 23 is embedded in a part of the trench 20 on the gate insulating film 21 and the gate electrode 22 to a second height H2 which is higher than the first height H1. The source electrode 33 is embedded in the remaining part of the trench 20. In this way, the gate electrode 22 and the source electrode 33 are insulated from each other inside the trench 20 by the interlayer insulating film 23.

Base contact regions 14 are formed in regions of the front surface of the substrate 16 in which no trench 20 is formed. The base contact region 14 is heavily doped with P-type impurities, and has a depth to a third height H3 which is higher than the second height H2 and lower than the front surface of the substrate 16.

Source regions 13 are formed under the base contact regions 14. The source region 13 is in contact with the side surface of the trench 20, has a depth from the third height H3 to at least the first height H1 along the side surface of the trench 20, and is heavily doped with N-type impurities. The region of the base layer 12 that extends along the outer side surface of the trench 20 from the bottom surface of the source region 13 to the upper surface of the drain region 17 serves as a channel region.

In this way, according to the first embodiment, the source region 13 and the base contact region 14 are arranged in the vertical direction along the outer side surface of the trench 20. This configuration allows the source region 13 and the base contact region 14 to be in contact with the source electrode 33 on the side surface of the trench 20. As a result, it is not necessary to bring the source region 13 and the base contact region 14 into contact with the source electrode 33 on the upper surface of the substrate 16, and the semiconductor device 100 can therefore be downsized in the lateral direction (horizontal direction).

The source electrode 33 is embedded in the remaining parts of the trenches 20 as described above and is formed also over the entire front surface of the substrate 16. Further, a drain electrode 32 is formed over the entire rear surface of the substrate 16, namely, the entire bottom surface of the drain region 17.

Figure 2A:
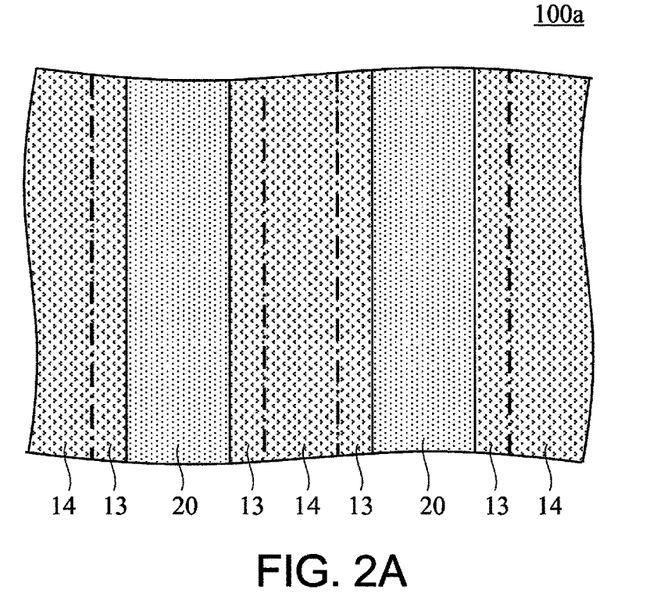
FIG. 2A is a view for illustrating a plane structure of the semiconductor device according to a first example of the first embodiment of the present invention.
Figure 2B:
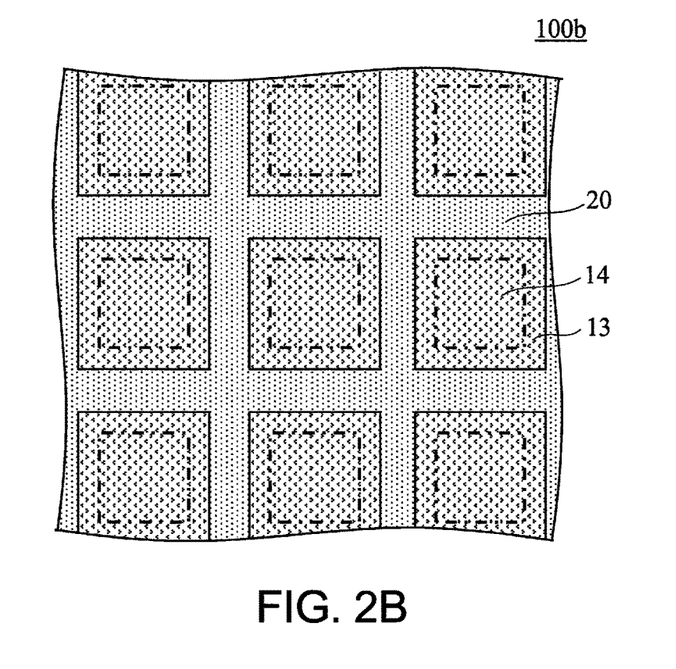
FIG. 2B is a view for illustrating a plane structure of the semiconductor device according to a second example of the first embodiment of the present invention.

FIG. 2A and FIG. 2B are illustrations of examples of the plane structures of the semiconductor device 100 of the first embodiment. FIG. 2A is an illustration of a plane structure 100a of a first example, and FIG. 2B is an illustration of a plane structure 100b of a second example. In each of FIG. 2A and FIG. 2B, the source electrode 33 is omitted.

As illustrated in FIG. 2A, in the plane structure 100a of the first example, the trenches 20 are formed in a stripe pattern, and the source regions 13, each of which extends along each side surface of the trench 20, are also formed in the stripe pattern. On the source regions 13, the base contact regions 14, each of which extends along each side surface of the trench 20, are also formed in the stripe pattern in the regions of the front surface of the substrate 16 in which no trench 20 is formed.

As illustrated in FIG. 2B, in the plane structure 100b of the second example, the trenches 20 are formed in a grid pattern. In each of the regions surrounded by the trench 20, the source regions 13, each of which is formed along the side surfaces of the trench 20, are fanned into a quadrilateral ring shape. On the ring-shaped source regions 13 in the respective regions surrounded by the trench 20, the base contact regions 14, each of which is formed along the side surfaces of the trench 20, are formed in the regions of the front surface of the substrate 16 in which no trench 20 is formed.

In this way, the plane structure of the trenches 20 may be in the stripe pattern or the grid pattern. Regardless of which of the patterns is employed, the semiconductor device 100 can be downsized in the lateral direction (horizontal direction), and a high channel density can be achieved because the source regions 13 are formed in all the regions extending along the side surfaces of the trenches 20, and hence the channel regions are not reduced.

Next, a method of manufacturing the semiconductor device 100 of the first embodiment illustrated in FIG. 1 is described with reference to the process sectional views of FIG. 3 to FIG. 11.

Figure 3:
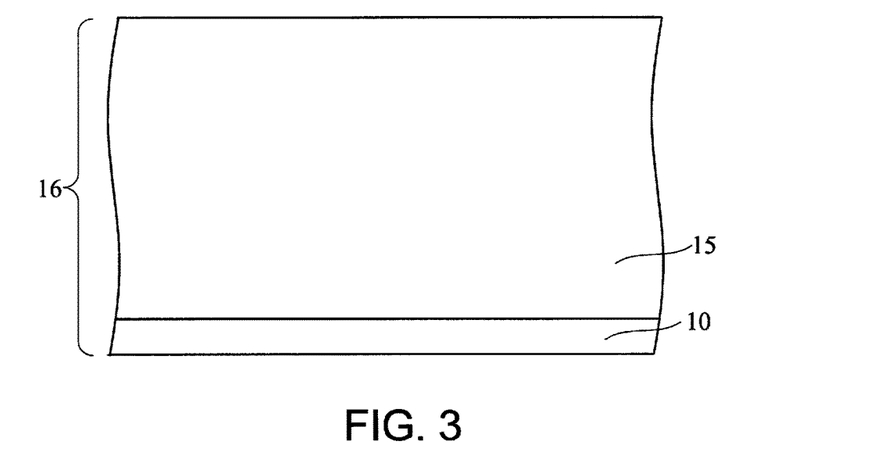
FIG. 3 is a sectional view for illustrating one process in a manufacturing method of the semiconductor device according to the first embodiment of the present invention.

As illustrated in FIG. 3, on the heavily-doped semiconductor substrate 10 heavily doped with N-type impurities, the epitaxial layer 15 doped with N-type impurities is formed by epitaxial growth. The substrate 16 is consequently formed.

Figure 4:
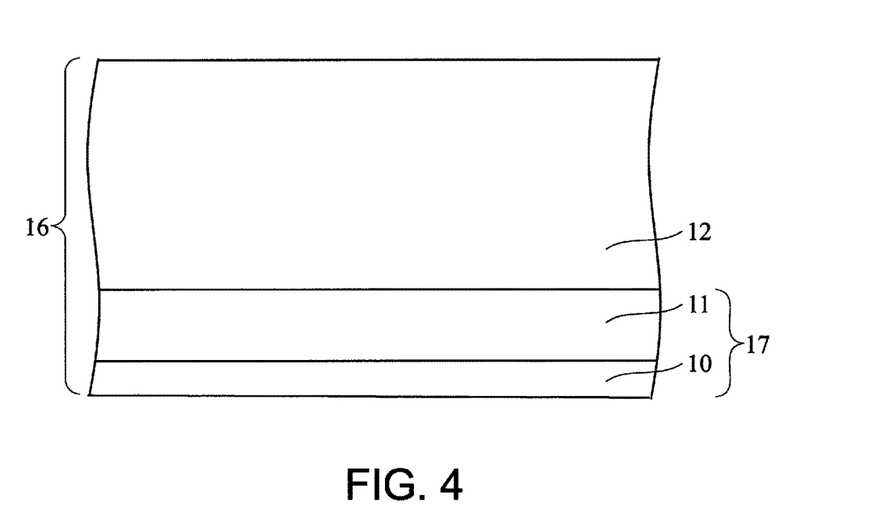
FIG. 4 is a sectional view for illustrating one process in the manufacturing method of the semiconductor device according to the first embodiment of the present invention.

Then, the resultant is doped with P-type impurities from the front surface of the epitaxial layer 15 (substrate 16) so that, as illustrated in FIG. 4, the P-type base layer 12 and the N-type semiconductor layer 11 that has the N-type epitaxial layer 15 remained under the base layer 12 are formed. The N-type drain region 17 that includes the N-type heavily-doped semiconductor substrate 10 and the N-type semiconductor layer 11 is consequently formed.

Figure 5:
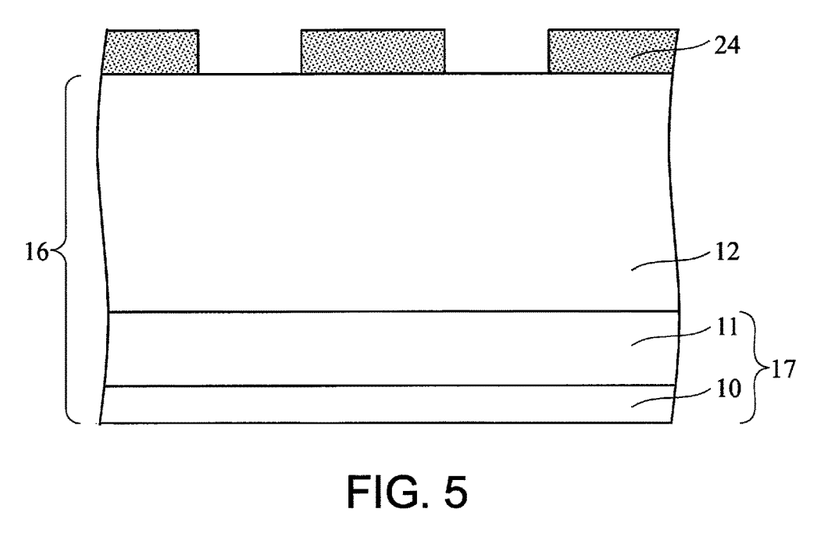
FIG. 5 is a sectional view for illustrating one process in the manufacturing method of the semiconductor device according to the first embodiment of the present invention.

Next, as illustrated in FIG. 5, an insulating film 24 is formed on the front surface of the substrate 16 by, for example, CVD, and then a photoresist pattern (not shown) that has openings at parts corresponding to the trenches 20 (see FIG. 1) is formed by photolithography. Subsequently, the insulating film 24 is patterned using the resist pattern as a mask to form openings at parts corresponding to the trenches 20.

Figure 6:
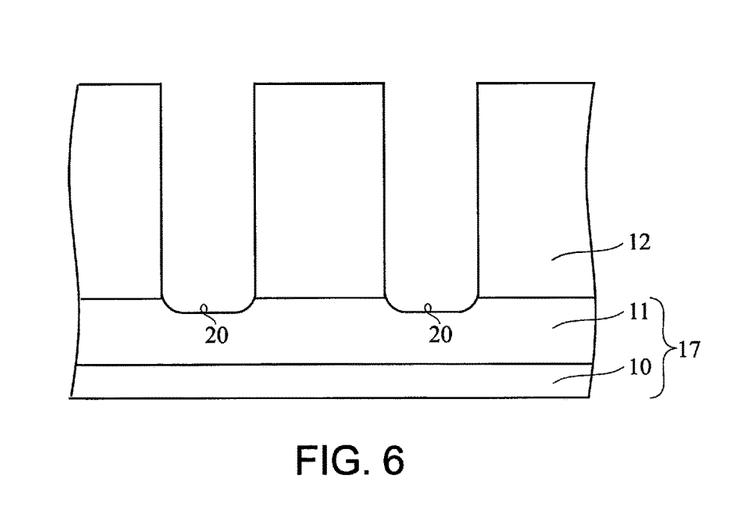
FIG. 6 is a sectional view for illustrating one process in the manufacturing method of the semiconductor device according to the first embodiment of the present invention.

Next, the base layer 12 is etched using the insulating film 24 as a mask to form the trenches 20 that reach the drain region 17 through the base layer 12, and then the insulating film 24 is removed, as illustrated in FIG. 6.

Figure 7:
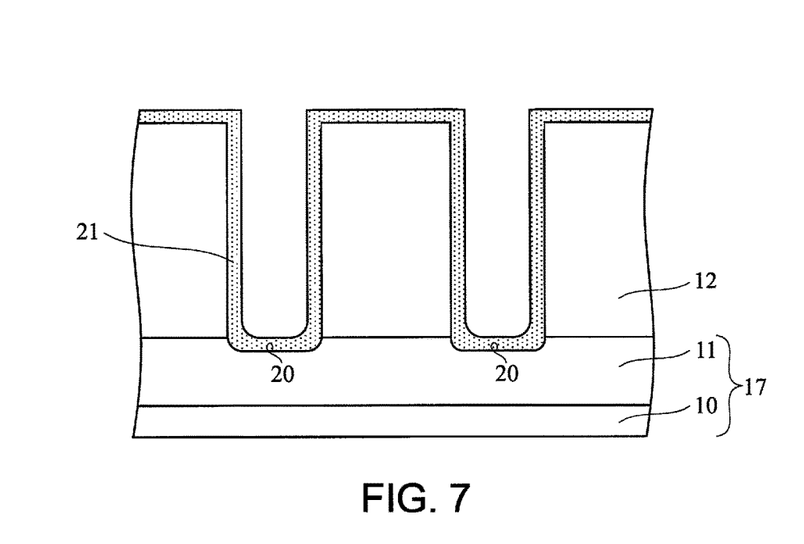
FIG. 7 is a sectional view for illustrating one process in the manufacturing method of the semiconductor device according to the first embodiment of the present invention.

After that, as illustrated in FIG. 7, the gate insulating film 21 is formed over the entire surface of the trench 20 which includes the bottom surface and the side surfaces. The gate insulating film 21 may be formed by thermally oxidizing the upper surfaces of the base layer 12 and the drain region 17 or forming a dielectric by CVD, for example.

Figure 8:
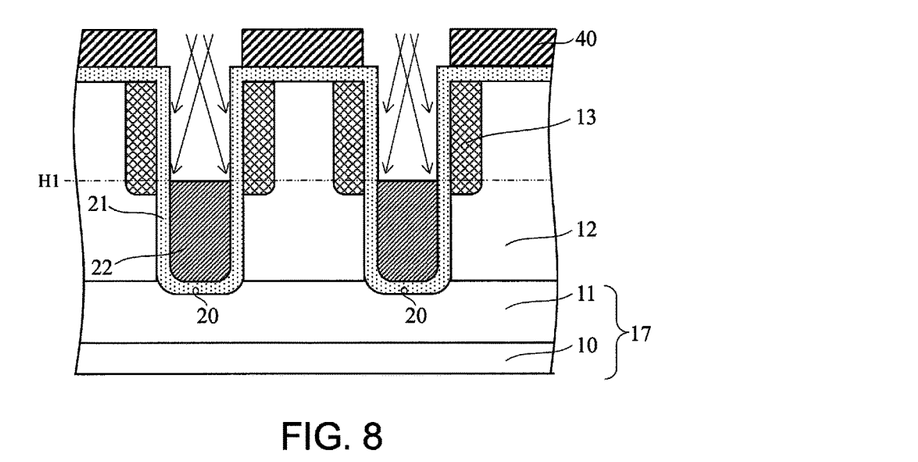
FIG. 8 is a sectional view for illustrating one process in the manufacturing method of the semiconductor device according to the first embodiment of the present invention.

Subsequently, a gate electrode material is embedded in the trench 20 up to the upper part, and then is etched back to the first height H1 to form the gate electrode 22, as illustrated in FIG. 8.

Next, as illustrated in FIG. 8, a pattern of a photoresist 40 that has openings above the trenches 20 is formed. N-type impurities are obliquely implanted to the inner side surfaces of the trench 20 by ion implantation using the photoresist 40 as a mask. The source regions 13 are consequently formed along the side surfaces of the trench 20. At this time, the bottom surface of the source region 13 is located at a height equal to or a little deeper than the first height H1, at which the upper surface of the gate electrode 22 is located, and hence the overlap between the source regions 13 and the gate electrode 22 is made in a self-aligning manner.

Figure 9:
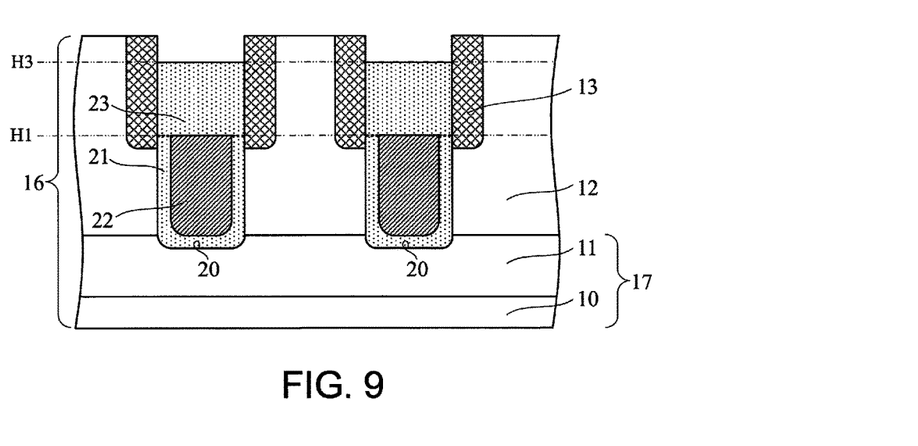
FIG. 9 is a sectional view for illustrating one process in the manufacturing method of the semiconductor device according to the first embodiment of the present invention.

After the photoresist 40 is removed, as illustrated in FIG. 9, a part of the gate insulating film 21 that is formed above the gate electrode 22 is removed. Then, an insulating film is embedded in the trench 20, and is etched back to the third height H3 which is lower than the front surface of the substrate 16 and higher than the first height H1. The interlayer insulating film 23 is consequently formed.

Figure 10:
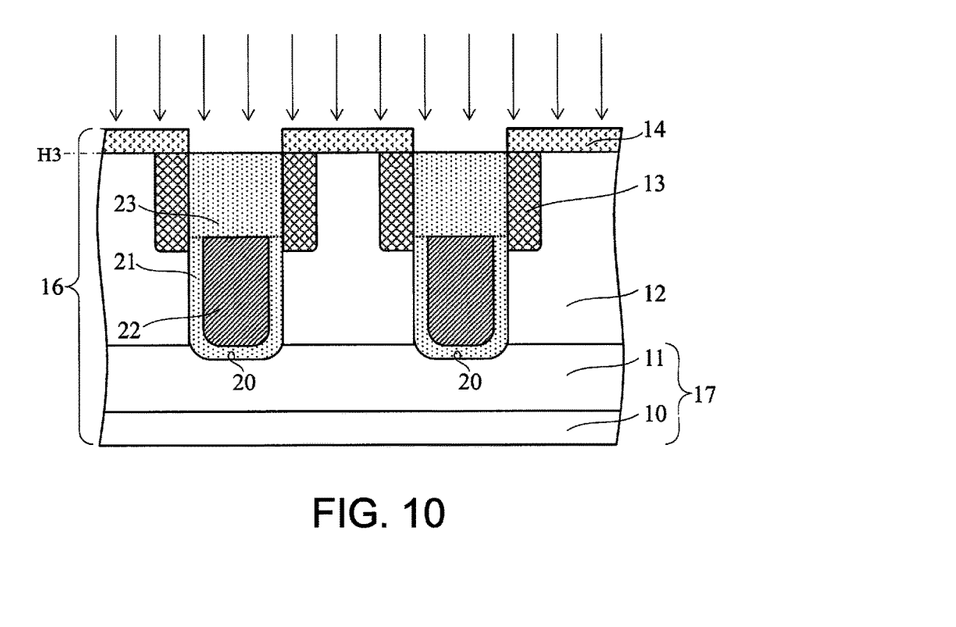
FIG. 10 is a sectional view for illustrating one process in the manufacturing method of the semiconductor device according to the first embodiment of the present invention.

After that, as illustrated in FIG. 10, P-type impurities are implanted into the entire surface of the resultant by ion implantation using the interlayer insulating film 23 as a mask for the source regions 13, to thereby form the base contact regions 14 that have a depth from the front surface of the substrate 16 to the third height H3. The angle of the ion implantation at this time is not limited to a particular angle.

Figure 11:
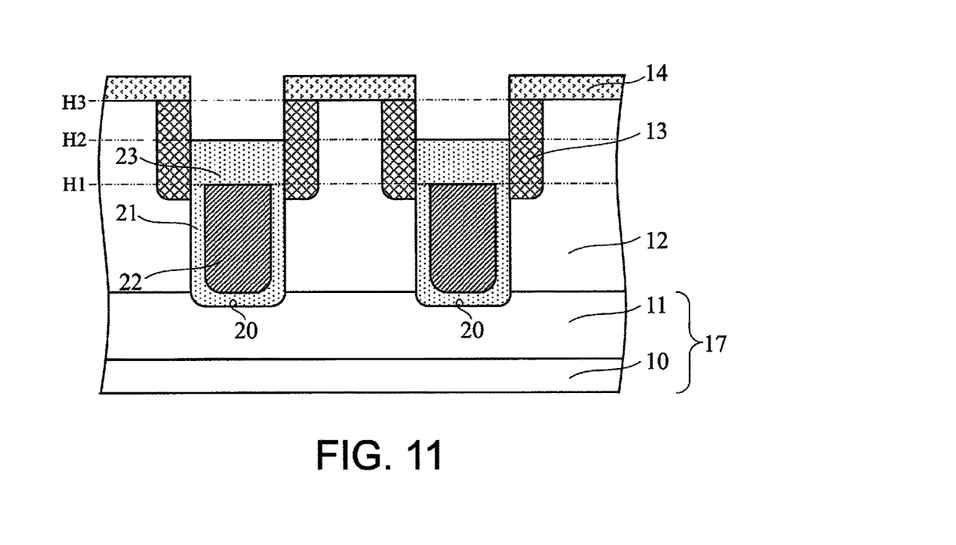
FIG. 11 is a sectional view for illustrating one process in the manufacturing method of the semiconductor device according to the first embodiment of the present invention.

After that, as illustrated in FIG. 11, the interlayer insulating film 23 is etched back again to a depth at the second height H2 which is higher than the first height H1 and lower than the third height H3. The interlayer insulating film 23 has a thickness enough to insulate the gate electrode 22 and the source electrode 33 (see FIG. 1) from each other.

Finally, the source electrode 33 is formed inside the trenches 20 and the entire front surface of the substrate 16 so that the source electrode 33 is in contact with the source regions 13 and the base contact regions 14. In addition, the drain electrode 32 is formed on the entire rear surface of the substrate 16. The semiconductor device 100 of the first embodiment illustrated in FIG. 1 is consequently obtained.

Figure 12:
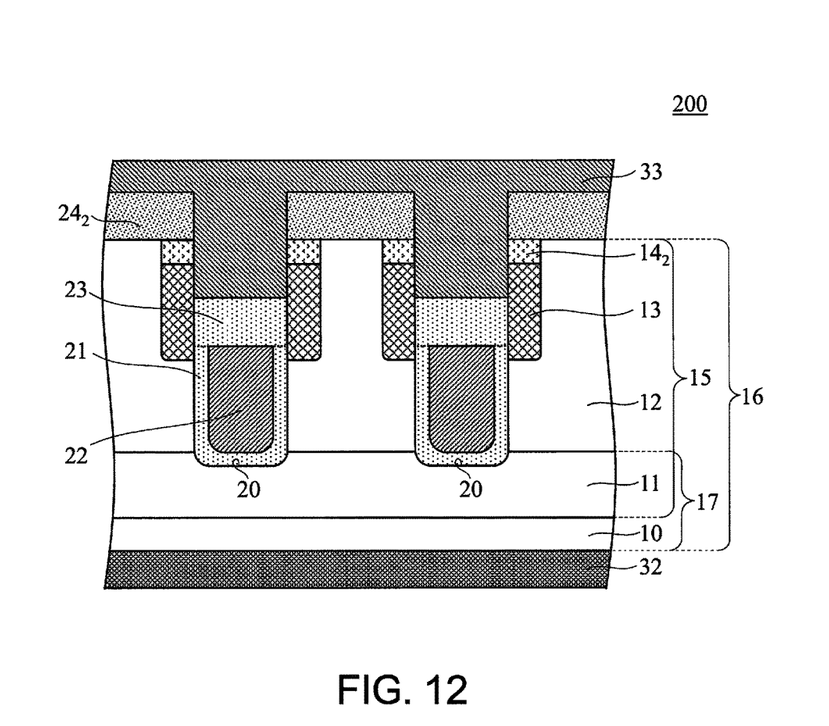
FIG. 12 is a sectional view for illustrating the structure of a semiconductor device according to a second embodiment of the present invention.

FIG. 12 is a sectional view for illustrating a semiconductor device 200 that includes a vertical MOSFET according to a second embodiment of the present invention. The same components as those of the semiconductor device 100 of the first embodiment illustrated in FIG. 1 are denoted by the same reference symbols, and redundant description is omitted as appropriate.

The semiconductor device 200 of the second embodiment differs from the semiconductor device 100 of the first embodiment in including base contact regions $14_2$ instead of the base contact regions 14, and an insulating film $24_2$ formed on the regions of the front surface of the substrate 16 in which no trench 20 is formed.

The base contact regions 14 in the semiconductor device 100, each of which is formed along each side surface of the trench 20, are formed in the regions of the front surface of the substrate 16 (base layer) in which no trench 20 is formed. In the semiconductor device 200, on the other hand, the base contact regions $14_2$ are formed on, of the regions of the front surface of the substrate 16 in which no trench 20 is formed, the source regions 13 extending along the side surfaces of the trenches 20. The base layer 12 is exposed on the remaining region of the front surface of the substrate 16. In short, one side surface of the base contact region $14_2$ is in contact with the source electrode 33 on the side surface of the trench 20, and the other side surface of the base contact region $14_2$ is in contact with the base layer 12.

According to the present embodiment, since the base contact region $14_2$ is in contact with the base layer 12 at the side surface, even when the interval between the adjacent trenches 20 is narrowed, the contact between the base contact region $14_2$ and the base layer 12 is secured. That is, the electrical connection between the base layer 12 and the source electrode 33 can be ensured.

Figure 13A:
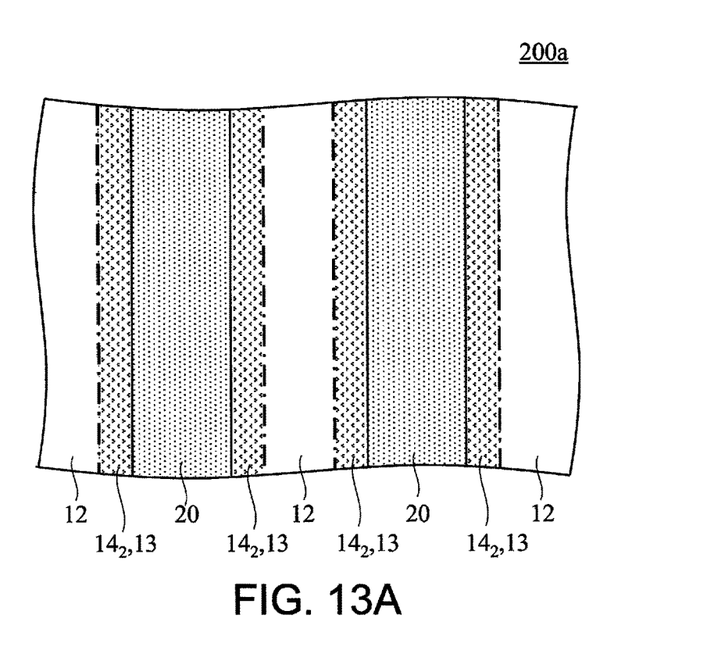
FIG. 13A is a view for illustrating a plane structure of the semiconductor device according to a first example of the second embodiment of the present invention.
Figure 13B:
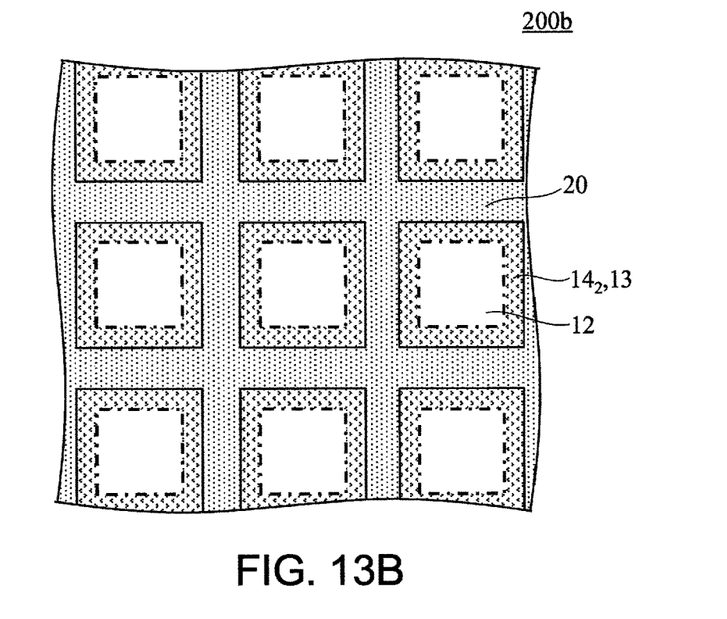
FIG. 13B is a view for illustrating a plane structure of the semiconductor device according to a second example of the second embodiment of the present invention.

FIG. 13A and FIG. 13B are illustrations of examples of the plane structures of the semiconductor device 200 of the second embodiment. FIG. 13A is an illustration of a plane structure 200a of a first example, and FIG. 13B is an illustration of a plane structure 200b of a second example. In each of FIG. 13A and FIG. 13B, the source electrode 33 and the insulating film $24_2$ are omitted.

Those plane structures are almost the same as those of the semiconductor device 100 of the first embodiment, and hence different points are mainly described.

As illustrated in FIG. 13A, in the plane structure 200a of the first example, the trenches 20 are formed in the stripe pattern, and the source regions 13, each of which extends along each side surface of the trench 20, are also formed in the stripe pattern. In addition, the base contact regions $14_2$, each of which extends along each side surface of the trench 20 while keeping subsequently the same width as that of the source regions 13, are also formed in the stripe pattern on the source regions 13. Hence, the base layer 12 is exposed on a region of the front surface of the substrate 16 that is located between the base contact regions $14_2$ located between the adjacent trenches 20.

As illustrated in FIG. 13B, in the plane structure 200b of the second example, the trenches 20 are formed in the grid pattern, and in each of the regions surrounded by the trench 20, the source regions 13, each of which is formed along the side surfaces of the trench 20, are formed into a quadrilateral ring shape. In addition, the base contact regions $14_2$, each of which is formed along the side surfaces of the trench 20 while keeping subsequently the same width as that of the source regions 13, are also formed into a quadrilateral ring shape on the source regions 13. Hence, the base layer 12 is exposed on a region of the front surface of the substrate 16 that is located in a central part of each of the regions surrounded by the trench 20.

In this way, also in the semiconductor device 200 of the second embodiment, the plane structure of the trenches 20 may be in the stripe pattern or the grid pattern. Regardless of which of the patterns is employed, the same effects as those of the above-mentioned semiconductor device 100 of the first embodiment can be obtained.

Next, a method of manufacturing the semiconductor device 200 of the second embodiment illustrated in FIG. 12 is described with reference to the process sectional views of FIG. 14 to FIG. 17.

Figure 14:
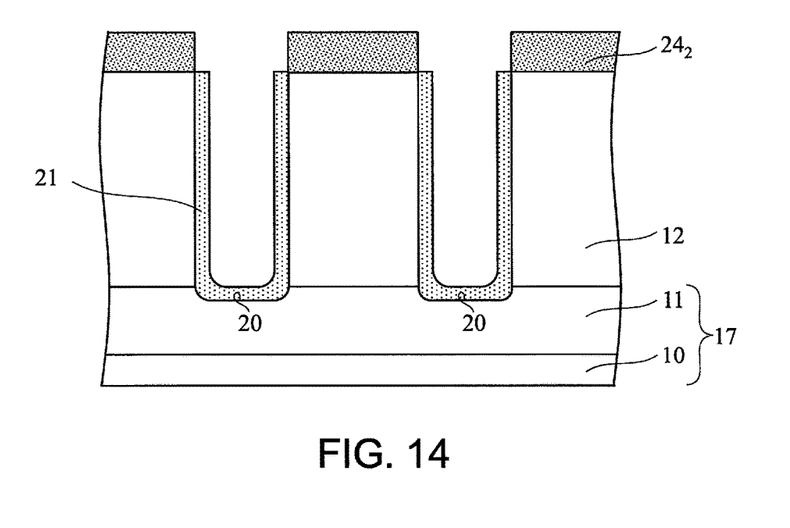
FIG. 14 is a sectional view for illustrating one process in a manufacturing method of the semiconductor device according to the second embodiment of the present invention.

After the processes of FIG. 3 to FIG. 5 are performed as in the first embodiment, as illustrated in FIG. 14, the gate insulating film 21 is formed on the bottom surface and the side surfaces of the trench 20 while the insulating film 24 remains as the insulating film $24_2$.

Figure 15:
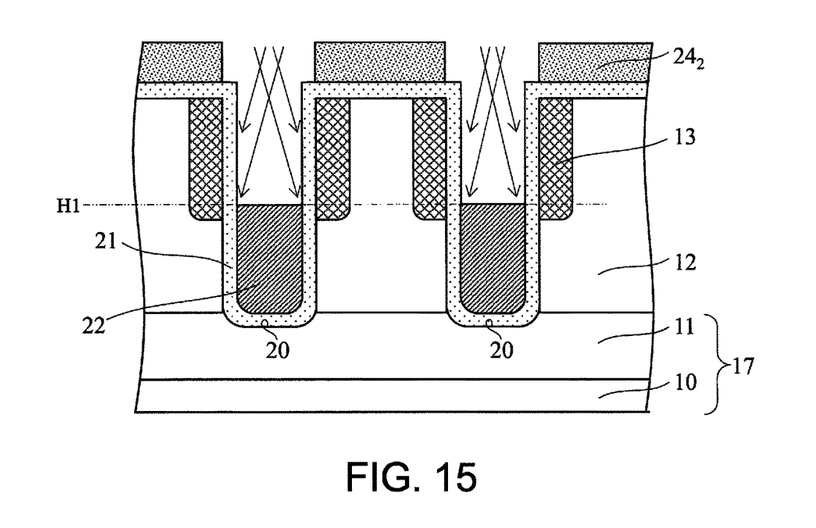
FIG. 15 is a sectional view for illustrating one process in the manufacturing method of the semiconductor device according to the second embodiment of the present invention.

After that, as illustrated in FIG. 15, the trench 20 is filled with a conductive material, for example, polysilicon, to the first height H1 to form the gate electrode 22. Impurities are obliquely implanted to the inner side surfaces of the trench 20 by ion implantation using the insulating film $24_2$ as a mask. The source regions 13 that extend along the side surfaces of the trench 20 and have a depth to at least the first height H1 are consequently formed. In this way, the insulating film $24_2$ is used as a mask in the ion implantation, and hence the process of mask patterning by the photolithography, which is included in the first embodiment, can be eliminated.

Figure 16:
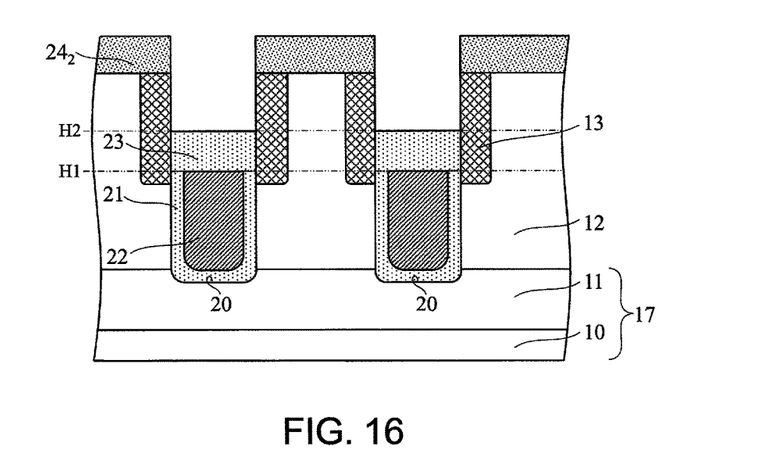
FIG. 16 is a sectional view for illustrating one process in the manufacturing method of the semiconductor device according to the second embodiment of the present invention.

Subsequently, as illustrated in FIG. 16, an insulating film is embedded in the trench 20, and is etched back to the second height H2 which is higher than the first height H1, to Ruin the interlayer insulating film 23.

Figure 17:
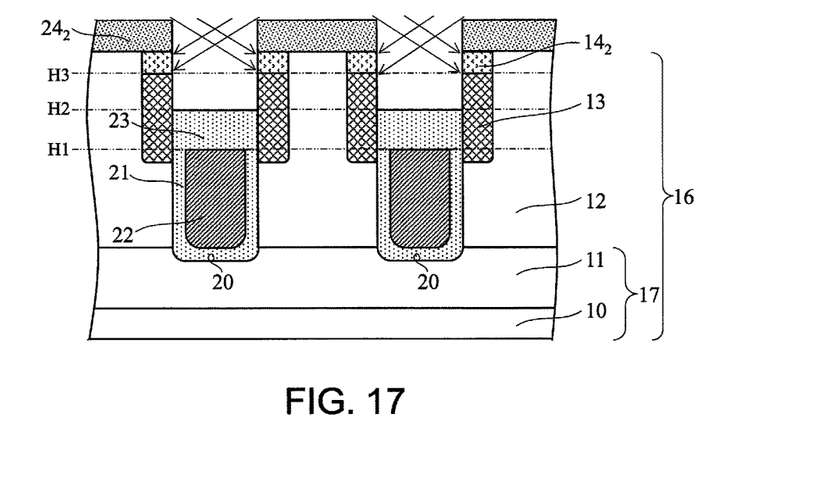
FIG. 17 is a sectional view for illustrating one process in the manufacturing method of the semiconductor device according to the second embodiment of the present invention.

Next, as illustrated in FIG. 17, impurities are obliquely implanted to the side surfaces of the trench 20 by ion implantation under a state in which the insulating film $24_2$ remains, to thereby form the base contact regions $14_2$. The base contact region $14_2$ has a depth to the third height H3 which is lower than the front surface of the substrate 16 and higher than the second height H2, and has one side surface in contact with the side surface of the trench 20 and the other side surface in contact with the base layer 12. At this time, due to the presence of the insulating film $24_2$, the source regions 13 can be prevented from being implanted with the impurities. In short, the insulating film $24_2$ functions as a mask for the source regions 13. According to the second embodiment, in which the base contact regions $14_2$ are formed in this way, the interlayer insulating film 23 is not required to be etched back twice and the process of removing the insulating film $24_2$ is not included, unlike the first embodiment. Hence, the number of processes can be reduced compared to that in the first embodiment.

It is apparent that the present invention is not limited to the above embodiments, but may be modified and changed without departing from the scope and spirit of the invention.

For example, in the configurations of the semiconductor devices described in the above-mentioned embodiments, the P-type components and the N-type components may be changed to components of the opposite conductivity type.

Further, the shape of each region surrounded by the trenches 20 is a quadrangle in FIG. 2B and FIG. 13B which are the illustrations of the examples of the plane structures of the semiconductor devices according to the embodiments of the present invention. However, the shape of the region is not limited to a quadrangle, and may be an octagon, a circle, or another shape that is obtained by cutting the corners of a quadrangle.

What is claimed is:

1. A semiconductor device, comprising:
   a substrate;
   a drain region in the substrate and having a predetermined thickness from a rear surface of the substrate, the drain region of a first conductivity type;
   a trench extending to an upper surface of the drain region from a front surface of the substrate;
   a base layer on the drain region adjacent to the trench, the base layer of a second conductivity type;
   a gate insulating film covering an inner bottom surface and an inner side surface of the trench, the gate insulating film having an upper end portion located at a first height from an inner bottom surface of the trench;
   a gate electrode embedded in the trench to the first height via the gate insulating film;
   a first insulating film on the gate insulating film and the gate electrode in the trench and extending to a second height that is higher than the first height;
   a source electrode on the first insulating film and filling a remaining part of the trench;
   a base contact region having a depth from the front surface of the substrate to a third height that is higher than the second height and lower than an opening end of the trench and having a first side surface in contact with the source electrode and a second side surface in contact with the base layer, the base contact region of the second conductivity type and having a higher impurity concentration than the base layer;
   a source region having an upper surface in contact with a part of a bottom surface of the base contact region and one side surface in contact with an outer side surface of the trench and that is at least partially in contact with the source electrode, the source region of the first conductivity type and such that a region of the base layer that extends along the outer side surface of the trench from a bottom surface of the source region to the drain region serves as a channel region; and
   a drain electrode on the rear surface of the substrate and in contact with the drain region.

2. The semiconductor device according to claim 1, further comprising a second insulating film on the base contact region and having an opening connecting to the opening end of the trench,
   wherein the source electrode extends into the opening.

3. The semiconductor device according to claim 1, wherein the trench extends in a predetermined direction.

4. The semiconductor device according to claim 1, wherein the trench surrounds the base layer.

* * * * *